US011320875B2

(12) United States Patent
Lee et al.

(10) Patent No.: US 11,320,875 B2
(45) Date of Patent: May 3, 2022

(54) DISPLAY DEVICE

(71) Applicant: SAMSUNG ELECTRONICS CO., LTD., Suwon-si (KR)

(72) Inventors: Dongchan Lee, Suwon-si (KR); Dongoh Kim, Suwon-si (KR); Youngchan Lee, Suwon-si (KR); Jiseok Jung, Suwon-si (KR); Minwoo Cha, Suwon-si (KR); Yoongoo Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/002,167

(22) Filed: Aug. 25, 2020

(65) Prior Publication Data

US 2021/0303043 A1  Sep. 30, 2021

(30) Foreign Application Priority Data

Mar. 27, 2020 (KR) .................. 10-2020-0037551

(51) Int. Cl.
*G06F 1/20* (2006.01)
*H05K 7/20* (2006.01)
*G06F 1/18* (2006.01)

(52) U.S. Cl.
CPC ............... *G06F 1/20* (2013.01); *G06F 1/181* (2013.01); *H05K 7/20972* (2013.01)

(58) Field of Classification Search
CPC ........ G06F 1/20; G06F 1/181; H05K 7/20972
See application file for complete search history.

(56) References Cited

U.S. PATENT DOCUMENTS

| 10,165,712 | B1* | 12/2018 | Jang ..................... H05K 5/03 |
| 10,321,614 | B1* | 6/2019 | Huang .............. H05K 7/20972 |
| 11,262,817 | * | 3/2022 | Chin ..................... G05D 7/06 |
| 2009/0310059 | A1* | 12/2009 | Kim ................ G02F 1/133385 |
| | | | 349/58 |
| 2011/0058326 | A1* | 3/2011 | Idems ..................... G09F 9/30 |
| | | | 361/679.21 |

(Continued)

FOREIGN PATENT DOCUMENTS

| KR | 10-0669795 | 1/2007 |
| KR | 10-2016-0084279 | 7/2016 |

(Continued)

OTHER PUBLICATIONS

International Search Report dated Dec. 17, 2020 in International Patent Application No. PCT/KR2020/009921.

*Primary Examiner* — Stephen S Sul
(74) *Attorney, Agent, or Firm* — Staas & Halsey LLP

(57) ABSTRACT

Provided is a display device. The display device includes a housing including a front glass and a rear cover, a display panel arranged within the housing, and an air circulator arranged behind the display panel for circulating air between the front glass and the front surface of the display panel, wherein the air circulator includes a circulation fan circulating air, a case receiving the circulation fan and having open top to discharge air in a direction of long edges of the display panel, a first connection part formed to be open at one end of the case in the direction of long edges, and a second connection part formed to be open at the other end of the case in the direction of long edges.

18 Claims, 20 Drawing Sheets

(56) References Cited

U.S. PATENT DOCUMENTS

| | | | |
|---|---|---|---|
| 2011/0085302 A1* | 4/2011 | Nakamichi | H05K 7/20972 |
| | | | 361/695 |
| 2011/0167845 A1* | 7/2011 | Lee | F04D 25/166 |
| | | | 62/89 |
| 2012/0255721 A1* | 10/2012 | Kim | G09F 19/22 |
| | | | 165/288 |
| 2014/0334100 A1* | 11/2014 | Yoon | H05K 7/20145 |
| | | | 361/692 |
| 2015/0237761 A1* | 8/2015 | Dunn | F28D 9/00 |
| | | | 362/97.3 |
| 2015/0261037 A1 | 9/2015 | Cho | |
| 2016/0205805 A1* | 7/2016 | Chou | G06F 1/20 |
| | | | 361/695 |
| 2017/0172016 A1* | 6/2017 | Kang | G09F 9/33 |
| 2018/0160573 A1* | 6/2018 | Kim | H05K 7/20209 |
| 2018/0199450 A1* | 7/2018 | Kim | G02F 1/133385 |
| 2019/0021189 A1* | 1/2019 | Kim | H05K 7/20181 |
| 2019/0159363 A1* | 5/2019 | Jang | G09F 9/30 |

FOREIGN PATENT DOCUMENTS

| | | |
|---|---|---|
| KR | 10-1847981 | 4/2018 |
| KR | 10-2019-0058814 | 5/2019 |

* cited by examiner

DISPLAY DEVICE

CROSS-REFERENCE TO RELATED APPLICATION

This application is based on and claims priority under 35 U. S. C. § 119 to Korean Patent Application No. 10-2020-0037551 filed on Mar. 27, 2020, the disclosure of which is incorporated herein by reference in its entirety.

BACKGROUND

1. Field

The disclosure relates to a display device, and more particularly, to a display device capable of managing internal heat using a modularized air circulator.

2. Discussion of Related Art

Display devices are devices for displaying images on a screen, such as televisions (TVs), monitors for computers, digital information displays, etc. More of the display devices are installed for outdoor or exterior advertisement these days. For example, there is a billboard arranged outside a building to display an image.

When a display panel of the display device is directly exposed to sun light, surface temperature of the display panel rises and causes degradation of the display panel.

The display device may include the display panel and a backlight unit for transmitting light to the rear surface of the display panel. The display panel may be formed with a pair of substrates facing each other with a liquid crystal layer therebetween. The backlight unit may include a light source that provides light to the display panel. The light source of the backlight unit irradiates not only the light but also heat, which may also degrade the display panel.

SUMMARY

According to an embodiment of the disclosure, a display device includes a housing including a front glass and a rear cover, a display panel arranged within the housing, and an air circulator arranged behind the display panel for circulating air between the front glass and the front surface of the display panel, and including a case and a circulation fan arranged in the case, wherein the case includes an outlet formed to discharge air in a first direction, a first connection port formed at one end of the case in a second direction perpendicular to the first direction, and a second connection port formed at the other end of the case in the second direction.

The outlet may be formed on upper portion of the case.

The outlet may extend from the one end to the other end of the case in the second direction.

The display device may further include an outer frame coupled to the front glass and the rear cover, an upper area formed between the outer frame and an upper surface of the display panel, and a front area formed between the front glass and a front surface of the display panel, and the air discharged from the air circulator may be guided past the upper area to the front area.

The air of the front area may passes a lower area between the outer frame and a lower surface of the display panel.

The air having passed the lower area may be withdrawn to the air circulator.

The bottom of the case may be sealed to prevent air leaks a first coupling protrusion may be formed at the one end of the case in the second direction, and a second coupling protrusion is formed at the other end of the case in the second direction.

The first coupling protrusion may protrude to an inside of the case from an inner surface of the case, and the second coupling protrusion may protrude to an outside of the case from an outer surface of the case.

The display device may further include a first blocking member coupled to the first connection port to seal the first connection port, and a second blocking member coupled to the second connection port to seal the second connection port.

The first coupling protrusion may be formed on the first connection port and the second coupling protrusion may be formed on the second connection port, and the first blocking member may be coupled to the first coupling protrusion and the second blocking member may be coupled to the second coupling protrusion.

The first blocking member may include a first assembling protrusion protruding to an outside of the first blocking member from an outer surface of the first blocking member to be coupled to the first coupling protrusion, and the second blocking member may include a second assembling protrusion protruding to an inside of the second blocking member from an inner surface of the second blocking member to be coupled to the second coupling protrusion.

The air circulator may be provided in the plural, and the plurality of air circulators may include a first air circulator and a second air circulator arranged in the second direction, and the second coupling protrusion of the first air circulator may be coupled to the first coupling protrusion of the second air circulator.

The case may include a front case arranged adjacent to the display panel and a rear case arranged adjacent to the rear cover, and the first and second coupling protrusions may be provided on the front case.

The display device may further include an inlet arranged at the rear surface of the case to suck air into the air circulator.

According to another embodiment of the disclosure, a display device includes a display panel displaying an image, a front glass arranged on the front of the display panel, a rear plate arranged on the back of the display panel to support the display panel, and an air circulator arranged behind the rear plate for circulating air between the front surface of the display panel and the front glass, wherein the air circulator comprises a circulation fan circulating air and a case accommodating the circulation fan, and a top of the case is opened.

A bottom of the case may be sealed to prevent air leaks.

According to another embodiment of the disclosure, a display device includes a housing including a front glass and a rear cover, a display panel arranged within the housing, and first and second air circulators separately arranged behind the display panel for circulating air between the front glass and the front surface of the display panel, wherein the first and second air circulators each include a circulation fan circulating air, and a case accommodating the circulation fan, wherein the case includes an outlet formed to discharge air in a first direction, a first connection port formed at one end of the case in a second direction perpendicular to the first direction, and a second connection port formed at the other end of the case in the second direction.

The first and second air circulators each may further include a first coupling protrusion and a second coupling protrusion.

The first coupling protrusion may protrude to an inside of the case of the first air circulator from an inner surface of the case of the first air circulator at the one end, and the second coupling protrusion may protrude to an outside of the case of the second air circulator from an outer surface of the case of the second air circulator at the other end, and the second coupling protrusion of the first air circulator may be coupled to the first coupling protrusion of the second air circulator.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
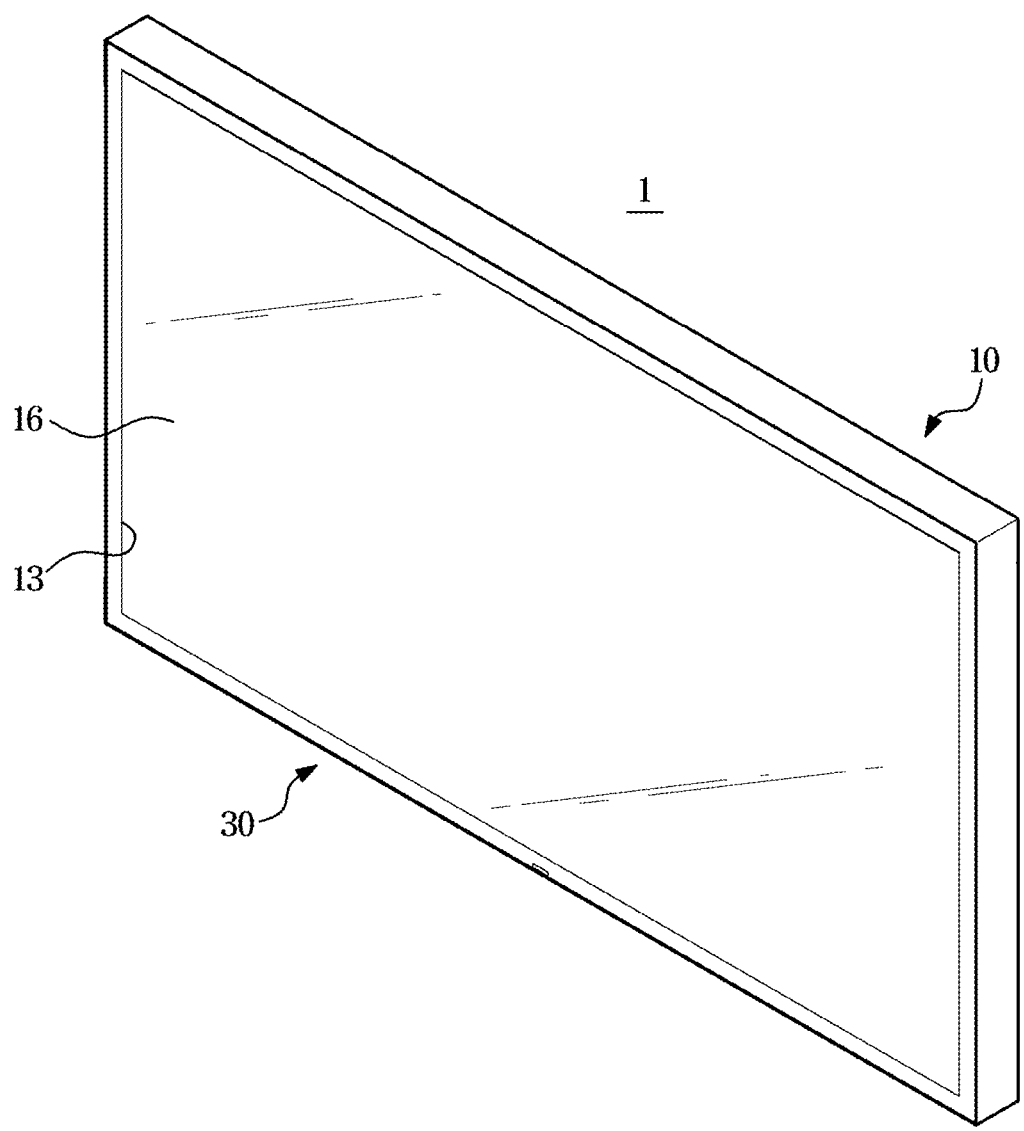
FIG. 1 shows a display device, according to an embodiment of the disclosure.

Embodiments and features as described and illustrated in the disclosure are merely examples, and there may be various modifications replacing the embodiments and drawings at the time of filing this application.

Throughout the drawings, like reference numerals refer to like parts or components.

The terminology used herein is for the purpose of describing particular embodiments only and is not intended to limit the disclosure. It is to be understood that the singular forms "a," "an," and "the" include plural references unless the context clearly dictates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. Thus, a first element, component, region, layer or chamber discussed below could be termed a second element, component, region, layer or section without departing from the teachings of the disclosure. Descriptions shall be understood as to include any and all combinations of one or more of the associated listed items when the items are described by using the conjunctive term "~ and/or ~," or the like.

The terms "front", "rear", "upper", "left", and "right" as herein used are defined with respect to the drawings, but the terms may not restrict the shape and position of the respective components.

The disclosure provides a display device including an air circulator to force circulation of the air inside the display device.

The disclosure also provides a display device that forces air to circulate on every corner of the front surface of its display panel, thereby preventing degradation of the display panel.

The disclosure also provides a display device with an air circulator easy to modularize and connect.

Reference will now be made in detail to embodiments of the disclosure, which are illustrated in the accompanying drawings, wherein like reference numerals refer to the like elements throughout.

Figure 2:
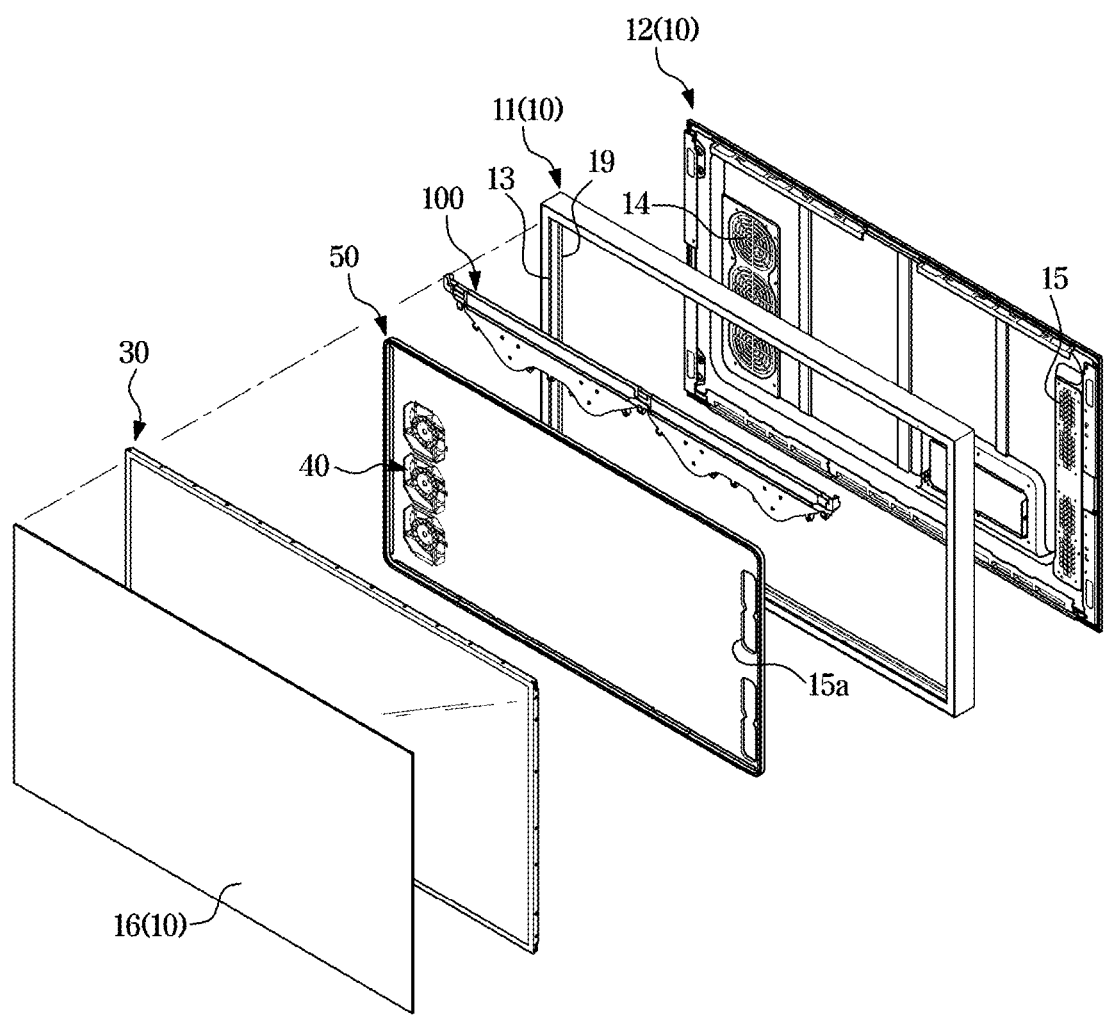
FIG. 2 is an exploded view of the display device shown in FIG. 1.

FIG. 1 shows a display device, according to an embodiment of the disclosure. FIG. 2 is an exploded view of the display device shown in FIG. 1.

Referring to FIGS. 1 and 2, a display device 1 may include a housing 10 that defines the appearance of the display device 1. The housing 10 may be provided for the display device 1 to be installed outdoors. The housing 10 may have an opening 13. Specifically, the opening 13 may be formed on the front of the housing 10. The display device 1 may further include a rear plate 50 coupled to the back of the display module 30. The rear plate 50 and the display module 30 may be coupled by a coupling rod (not shown). It is not, however, limited thereto, and there may be various coupling means. Furthermore, the housing 10 may include an inlet 14 and an outer outlet 15.

The housing 10 may include an outer frame 11. The outer frame 11 may have the shape of a box with the front and back open. The open front of the outer frame 11 may be defined as the opening 13. That is, the opening 13 may be formed on the front of the outer frame 11.

The housing 10 may further include a rear cover 12. The rear cover 12 may be coupled to the outer frame 11. Specifically, the rear cover 12 may be coupled to the open back of the outer frame 11 to form the exterior of the display device 1 with the outer frame 11. That is, the rear cover 12 may be coupled to a rear opening 19. The inlet 14 and the outer outlet 15 may be formed at the rear cover 12. The inlet 14 may be formed at the rear cover 12 for outside air to flow into the housing 10. The inlet 14 may be formed at a location corresponding to an outside air fan 40. The outside air fan 40 may be attached to the rear plate 50. The outer outlet 15 may be formed at the rear cover 12 for the outside air flowing into the housing 10 through the inlet 14 to be discharged out of the housing 10. A discharge port 15a may be formed on the rear cover 50 at a location corresponding to the outer outlet 15. The locations of the inlet 14 and the outer outlet 15 are not, however, limited thereto, but may be variously changed.

The display device 1 may further include a front glass 16 arranged to protect a display panel 34. Specifically, the housing 10 may include the front glass 16. The front glass 16 may be arranged in front of the display module 30 to protect the display panel 34. Specifically, the front glass 16 may be coupled to the front opening 13 of the housing 10.

The front glass 16 may have a corresponding size to the display module 30. Specifically, the front glass 16 may have a corresponding size to the display panel 34. More specifically, the front glass 16 may be arranged to correspond to a display area of the display panel 34, on which images are displayed.

Figure 3:
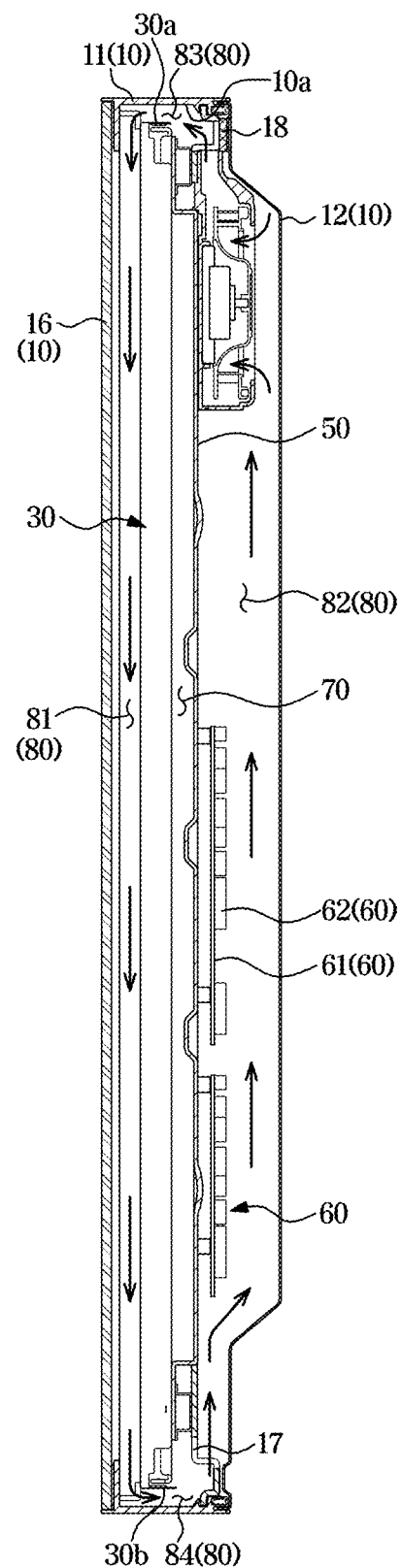
FIG. 3 is a side cross-sectional view of the display device shown in FIG. 1.
Figure 4:
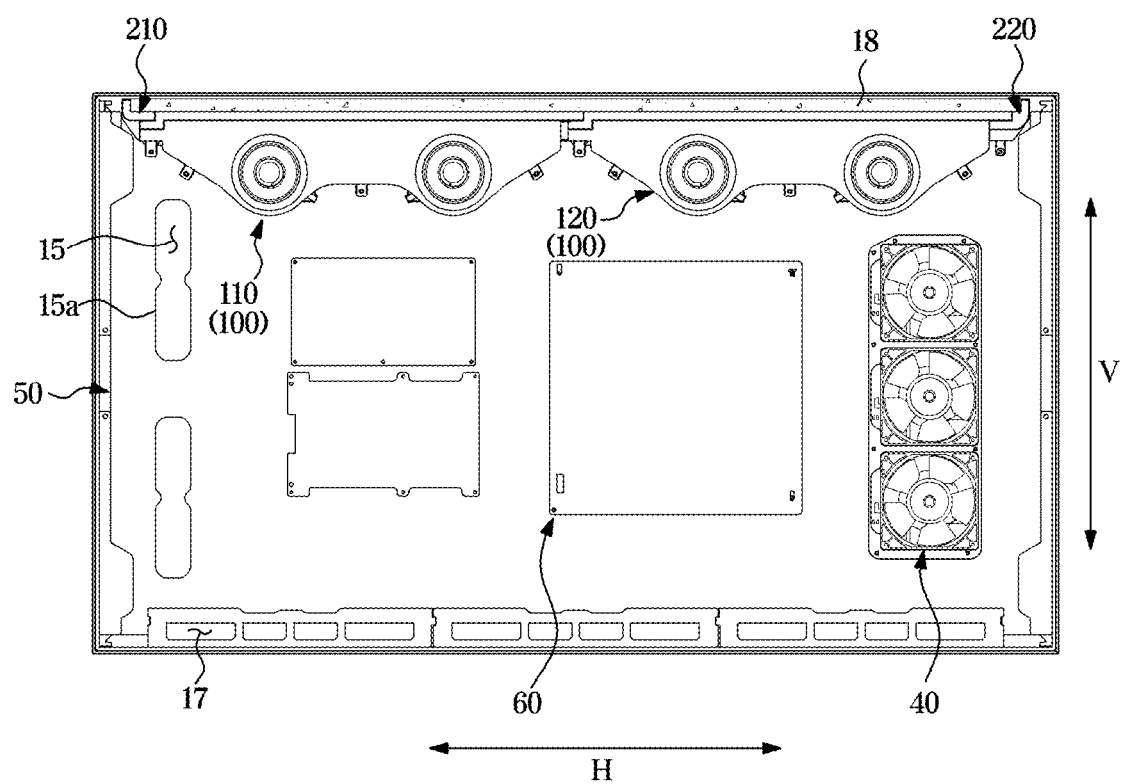
FIG. 4 shows a rear side of the display device shown in FIG. 1.

The display device 1 may include the display module 30. The display module 30 may be arranged within the housing 10. The display module 30 may be arranged within the housing 10 to be located behind the front glass 16. FIG. 3 is a side cross-sectional view of the display device shown in FIG. 1. FIG. 4 shows a rear side of the display device shown in FIG. 1.

Referring to FIGS. 3 and 4, the display device 1 may further include a control module 60. The control module 60 may be arranged within the housing 10 to drive the display module 30. In FIG. 4, the rear cover 12 is omitted.

The length of the display device 1 and the display module 30 in a horizontal direction H may be longer than that in a vertical direction V. The horizontal direction H may be referred to as a first direction H, and the vertical direction V may be referred to as a second direction V.

The control module 60 may be located in a first cooling flow path 70 of the display device 1. In this case where the control module 60 is arranged in the first cooling flow path 70 in a straight line in the vertical direction V of the display device 1, the display device 1 may be implemented in a slim design.

The control module 60 may be arranged under an air circulator 100. It is not, however, limited thereto, and the control module 60 may be arranged anywhere in the first cooling flow path 70 of the display device 1. For example, the control module 60 may be arranged above the air circulator 100. In this case, the air circulator 100 may be arranged at the bottom of the rear plate 50.

The control module 60 may include a circuit board 61.

The control module 60 may further include at least one electric part 62 mounted on the circuit board 61. The at least one electric part 62 may include a control processing unit (CPU), a switching mode power supply (SMPS), an LD, etc., which exchange information with one another and perform respective functions.

Sun light incident on the front surface of the display device 1 may raise the temperature of the display panel 34. Furthermore, a backlight unit 38 (see FIG. 8) arranged to supply light to the display panel 34 may also serve as a heating element, which may raise the internal temperature of the housing 10. Moreover, even the control module 60 may irradiate heat and raise the internal temperature of the housing 10 while driving the display module 30. When the internal temperature of the housing 10 rises, the temperature of the display panel 34 may also rise. Excessive heating of the display panel 34 may lead to degradation of the display panel 34. For a structure to prevent the degradation of the display panel 34, the display device 1 may further include elements as will be described below.

The display device 1 may further include a flow path formed within the housing 10 to reduce heat transferred from at least one of the display module 30 or the control module 60.

The air circulator 100 may be arranged at the rear top of the rear plate 50. That is, it may be arranged in a rear area 82. The air circulator 100 may circulate the internal air in the second cooling flow path 80. This may enable the heat irradiated to a front area 81 to be efficiently managed by sucking in air at the rear top of the rear plate 50 and supplying the air to the front area 81 through an upper area 83.

The air circulator 100 may include a first air circulator 110 and a second air circulator 120. The first and second air circulators 110 and 120 may be coupled to each other by coupling protrusions, as will be described later. The first air circulator 110 has an end coupled to a first blocking member 210 and the other end coupled to the second air circulator 120, and may thus circulate the internal air without air leaks. The second air circulator 120 has an end coupled to the first air circulator 110 and the other end coupled to a second blocking member 220, and may thus circulate the internal air without air leaks. The air circulator 100 may be modularized into the first and second air circulators 110 and 120, which may be applied to various sizes of display device.

Air leaks may be reduced due to a blocking member 200 and coupling protrusions 105a and 106a, which will be described later. The modularized air circulators 100 may be easily coupled, and may fully manage the heat irradiated from the display panel 34. The air circulator 100 may enable more effective circulation of the internal air, thereby reducing degradation of the display panel 34.

The flow path may include the first cooling flow path 70. The air brought by the outdoor air fan 40 into the housing 10 through the inlet 14 may be moved along the first cooling flow path 70. The first cooling flow path 70 may connect between the inlet 14 and the outer outlet 15. The first cooling flow path 70 may include an area in which the outdoor air brought in through the inlet 14 passes the space between the rear plate 50 and the display module 30 and is discharged from the outer outlet 15 through the discharge port 15a. The outdoor air brought in may reduce the temperature of the display panel 34 while passing behind the rear plate 50. In other words, the first cooling flow path 70 may extend in the horizontal direction H.

The flow path may further include the second cooling flow path 80. The second cooling flow path 80 may include the front area 81 formed between the front glass 16 and the display module 30, the rear area 82 formed between the rear cover 12 and the display module 30, the upper area 83 formed between the outer frame 11 and a top surface 30a of the display module 30, and a lower area 84 formed between the outer frame 11 and a bottom surface 30b of the display module 30. The internal air may be sucked in by the air circulator 100 arranged in the upper portion of the display device, flowing past the upper area 83 to the front area 81. The internal air that has passed the front area 81 may go out of an outlet 17 through the lower area 84 and may flow into the rear area 82. Accordingly, the internal air may be withdrawn into the air circulator 100 through the lower area 84, i.e., the air is circulated, thereby managing heat of the front area 81. Although the air circulator 100 is shown as being located in the upper portion of the display device, it is not limited thereto, and may be located in a lower portion of the display device. Besides, the air circulator 100 may be arranged in other various locations at which to allow circulation of the internal air.

In this case, the air moving along the first cooling flow path 70 and the air moving along the second cooling flow path 80 do not mix with each other. Specifically, the air moving between the rear plate 50 and the display module 30 through the inlet 14 and the outer outlet 15 and the air moving in the front area 81 and the rear area 82 through the air circulator 100 do not mix with each other. Accordingly, even when a foreign material such as a grit or dust is contained in the outdoor air passing the first cooling flow path 70, it may not influence the control module 60 and the display module 30 inside.

The second cooling flow path 80 may be formed along edges of the display panel 30.

The second cooling flow path 80 may be shaped like a closed loop.

The heat irradiated from the display device may be efficiently transferred and discharged due to the first and second cooling flow paths 70 and 80. This enables a high brightness of the display device to be implemented.

The display device may further include a sealing member 18 arranged within the housing 10. The sealing member 18 may seal the space between the air circulator 100 and a housing top 10a to prevent the air circulating in the second cooling flow path 80 from leaking out from the top of the housing 10. Accordingly, air leaks may be minimized, and thus the air may circulate the heat in the front area 81 may be more well circulated.

Although the display device 1 is shown as having the length in the first direction H longer than the length in the second direction V, it is not limited thereto and the opposite may be the case, i.e., the length in the first direction H may be shorter than the length in the second direction V.

Figure 5:
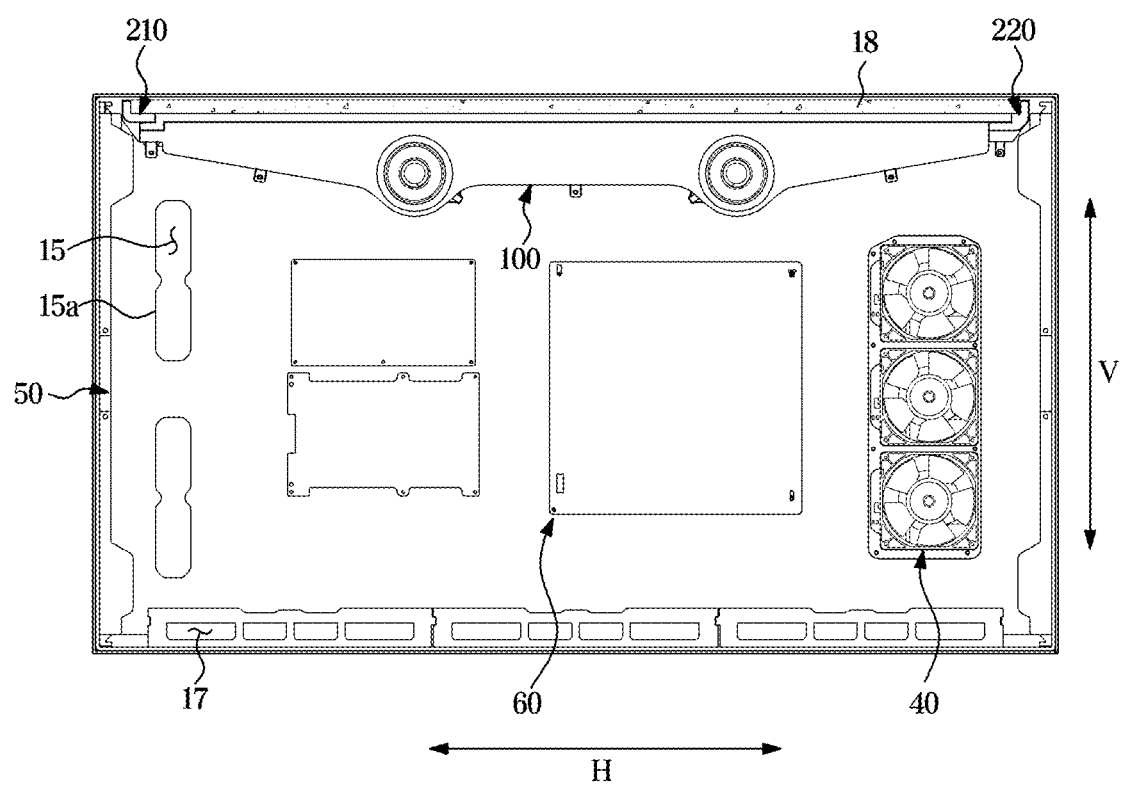
FIG. 5 shows a rear side of a display device according to another embodiment of the disclosure.
Figure 6:
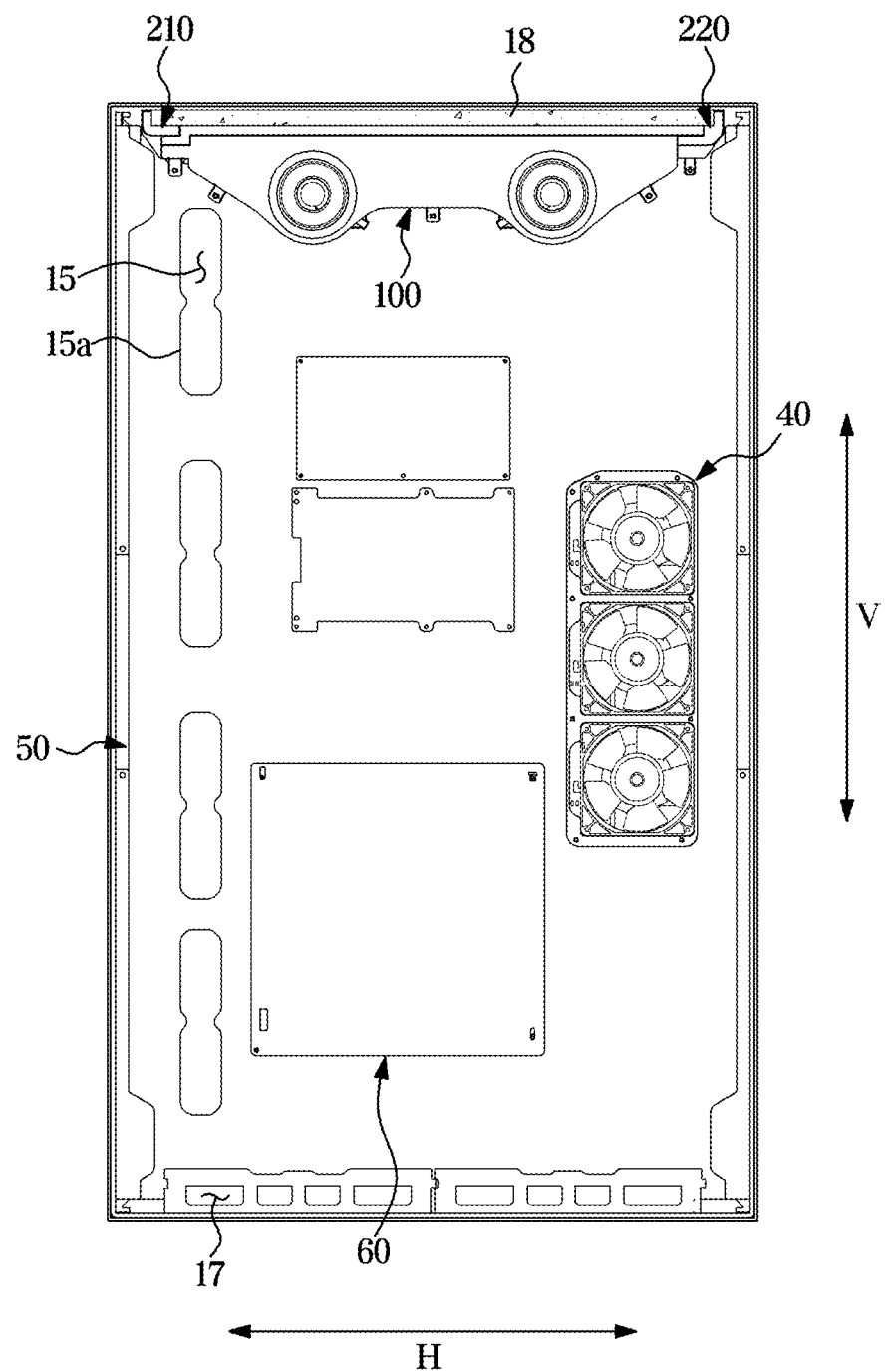
FIG. 6 shows a rear side of a display device according to another embodiment of the disclosure.
Figure 7:
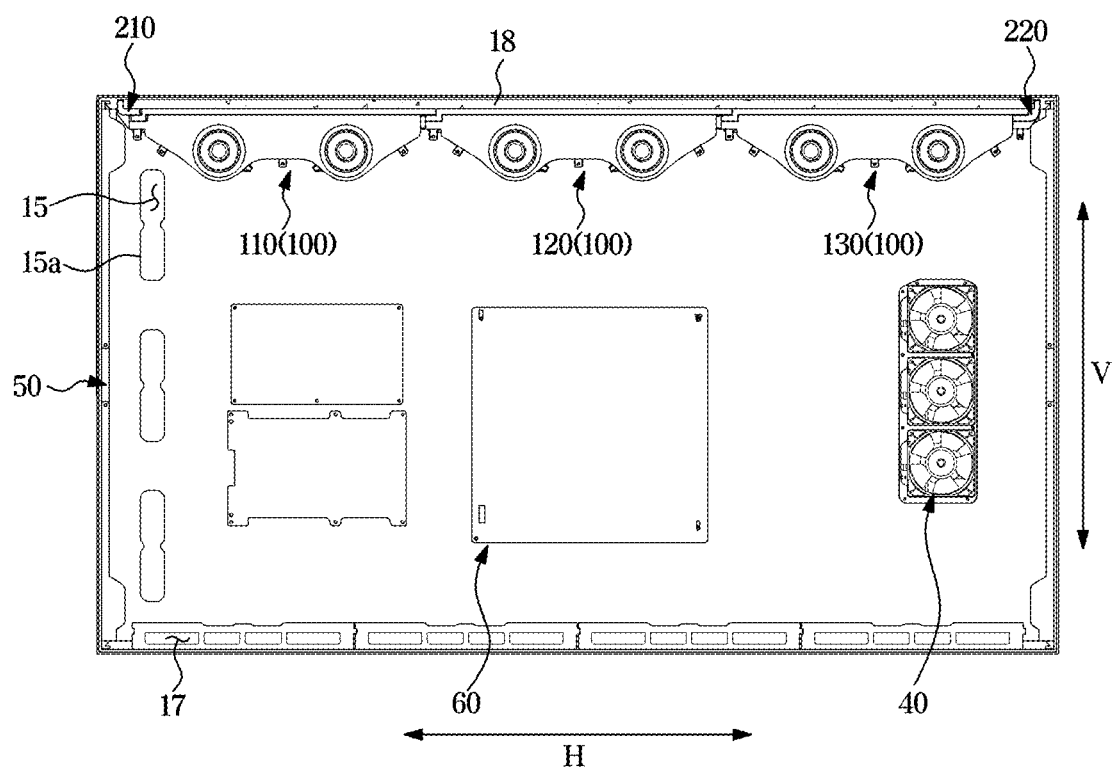
FIG. 7 shows a rear side of a display device according to another embodiment of the disclosure.

FIG. 5 shows a rear side of a display device according to another embodiment of the disclosure. FIG. 6 shows a rear side of a display device according to another embodiment of the disclosure. FIG. 7 shows a rear side of a display device according to another embodiment of the disclosure.

Referring to FIGS. 5 to 7, there may be one or more than two air circulators 100 arranged in the display device 1.

As shown in FIG. 5, there may be a single air circulator 100. For example, the air circulator 100 may be used in a small display device 1.

As shown in FIG. 6, even when the length of the display device 1 in the first direction H is shorter than that in the second direction V, the air circulator 100 may be arranged in the display device 1.

As shown in FIG. 7, there may be three or more air circulators 100 provided in the display device. For example, the air circulator 100 may be used in a large display device 1. The air circulator 100 may include a third air circulator 130 in addition to the first and second air circulators 110 and 120.

Figure 8:
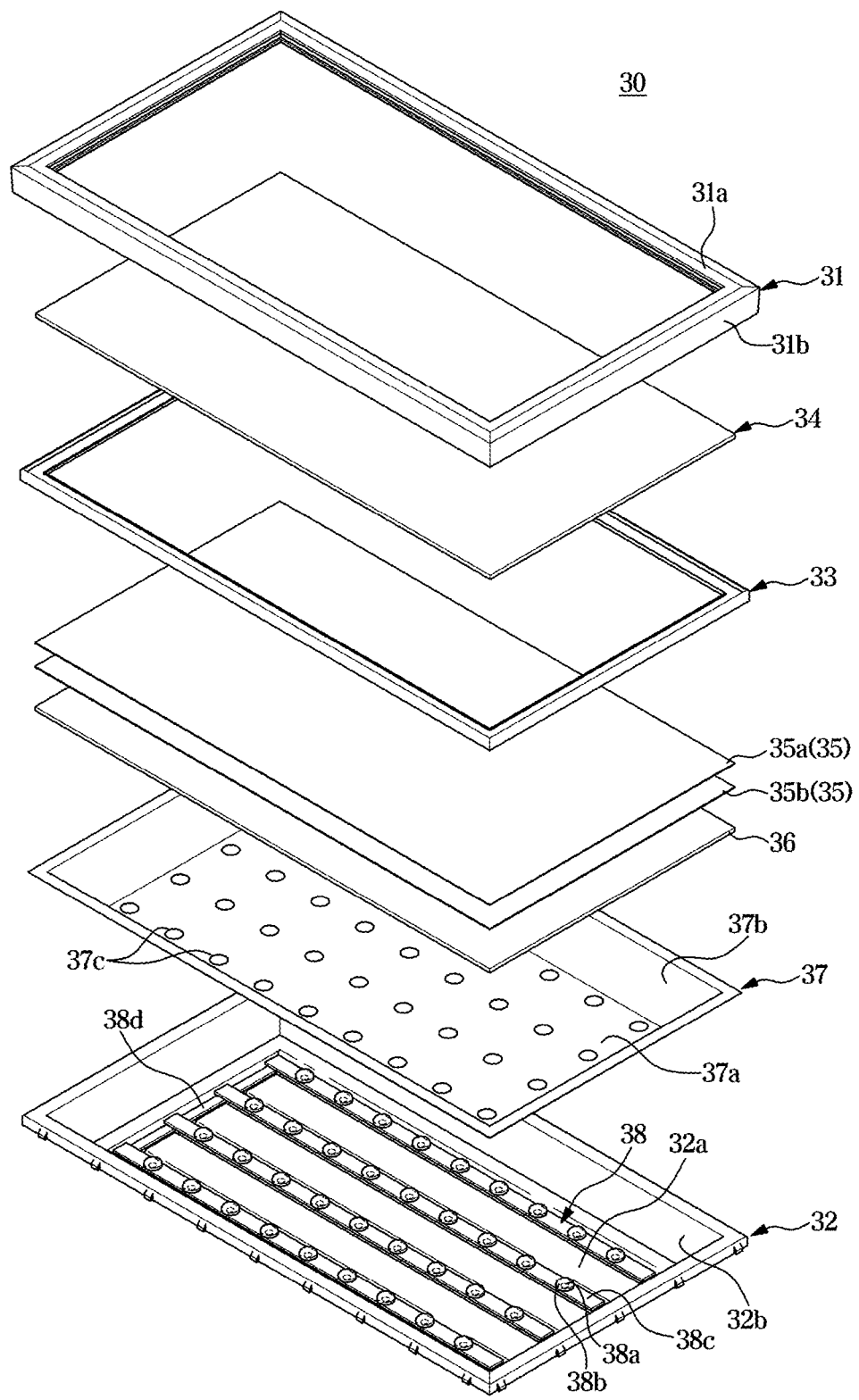
FIG. 8 is an exploded view of a display module in the display device shown in FIG. 1.

FIG. 8 is an exploded view of a display module in the display device shown in FIG. 1.

Referring to FIG. 8, the display module 30 may include a top chassis 31 defining a front exterior, a bottom chassis 32 defining a rear exterior, and a mold frame 33 arranged between the top chassis 31 and the bottom chassis 32.

The top chassis 31 may be coplanar with the display panel 34 for displaying images such that edges of the display panel 34 are not exposed. The top chassis 31 may include a bezel 31a covering front edges of the display panel 34, and a top flank 31b bending backwards from edges of the bezel 31a.

The bottom chassis 32 may be arranged behind the display panel 34. The bottom chassis 32 may protect various components included in the display module 30 against external shocks. The backlight unit 38 may be installed on the bottom chassis 32. The bottom chassis 32 may be shaped substantially like a rectangular. The shape of the bottom chassis 32 is not, however, limited to the rectangular. The bottom chassis 32 may include a bottom rear part 32a arranged to receive the backlight unit 38, and a bottom flank part 32b extending forward from edges of the bottom rear part 32a. A receiving groove (not shown) concavely formed to receive a circuit board 38c of the backlight unit 38 may be formed at the bottom rear part 32a.

The mold frame 33 may be formed to support the display panel 34 and a light diffuser plate 36. The mold frame 33 may support the display panel 34 arranged in front of the mold frame 33 and the light diffuser plate 36 arranged behind the mold frame 33. The top chassis 31 may be installed in front of the mold frame 33 so that the display panel 34 is kept installed at the mold frame 33. The bottom chassis 32 may be installed behind the mold frame 33.

The display module 30 may include the display panel 34. A screen may be provided on the display panel 34. The display panel 34 may display various images on the screen according to image signals input from the outside. In this case, the display panel 34 may be one of a light emitting display panel that creates an image with a plurality of pixels constituting the display panel 34 producing self-light, and a non-light emitting display panel that creates an image with the plurality of pixels reflecting/transmitting/blocking light. In the following description, it is assumed that the display panel 34 is the non-light emitting panel that creates an image by reflecting/transmitting/blocking light irradiated from the backlight unit 38.

Although not shown, the display panel 34 may include a liquid crystal layer, a transparent electrode layer, a transparent substrate, and a color filter.

The display panel 34 may create an image by blocking or transmitting light produced from the backlight unit 38, as will be described below. Specifically, each pixel of the display panel 34 blocks or transmits light from the backlight unit 38, thereby creating an image with various colors.

The display module 30 may further include the backlight unit (BLU) 38 for supplying light to the display panel 34. The BLU 38 may be arranged behind the display panel 34.

The BLU 38 may include a plurality of light sources 38a for producing light. The plurality of light sources 38a are elements for irradiating light. The plurality of light sources 38a may include not only light emitting diodes (LEDs) but also all the devices for producing and irradiating light. The plurality of light sources 38a may be installed on the front surface of the circuit board 38c to face the light diffuser plate 36. The plurality of light sources 38a may irradiate light toward the display panel 34.

The BLU 38 may further include a plurality of lenses 38b respectively covering the plurality of light sources 38a. The plurality of lenses 38b may be installed over the plurality of light sources 38a to diffuse light produced from the plurality of light sources 38a. The plurality of lenses 38b may have a circular shape, but may have other various shapes. The plurality of lenses 38b may be implemented with a resin having a light transmission property. For example, the plurality of lenses 38b may be implemented with polycarbonate (PC), polymethylmethacrylate (PMMA), acrylic, etc. Materials of the plurality of lenses 38b are not limited thereto, but may include other various materials such as glass.

Furthermore, the BLU 38 may further include the circuit board 38c with the plurality of light sources 38a mounted thereon. The circuit board 38c may include at least one of a printed circuit board (PCB) or a flexible copper clad laminate (FCCL).

The circuit board 38c may be arranged on the bottom chassis 32. The circuit board 38c may extend to be longer in a direction to correspond to the display panel 34. A conductive pattern may be formed on the circuit board 38c. The plurality of light sources 38a and the circuit board 38c may be electrically connected by wire bonding or flip chip bonding.

The BLU 38 may include a plurality of circuit boards 38c separately arranged in parallel with each other. In each of the circuit boards 38c, the plurality of light sources 38a and the plurality of lenses 38b respectively installed for the plurality of light sources 38a may be separately arranged in a direction of the length of the plurality of circuit boards 38c. The plurality of circuit boards 38c may be interconnected by a connection board 38d.

The BLU 38 may further include a reflector sheet 37 arranged behind the circuit board 38c. The reflector sheet 37 may be arranged on the inner surface of the bottom chassis 32. The reflector sheet 37 may reflect the light irradiated toward the inner surface of the bottom chassis 32 to the display panel 34.

The reflector sheet 37 may include a sheet rear part 37a arranged on the inner surface of the bottom rear part 32a defining the back of the rear surface of the bottom chassis 32, and a sheet flank part 37b extending forward from edges of the sheet rear part 37a.

Through holes 37c may be formed at the sheet rear part 37a. Specifically, the through holes 37c may be arranged at the sheet rear part 37a to respectively correspond to the plurality of light sources 38a and the plurality of lenses 38b. The plurality of light sources 38a and the plurality of lenses 38b may protrude to the inside of the reflector sheet 37 through the through holes 37c. Accordingly, the light produced from the plurality of light sources 38a may be transferred to the display panel 34 arranged in front, and the light reflected backward by e.g., the light diffuser plate 36 is reflected by the reflector sheet 37 back to the front.

The BLU 38 may further include a quantum dot sheet (not shown) that receives light irradiated from the plurality of light sources 38a and output white light (a mixture of light in various colors).

The display module 30 may further include the light diffuser plate 36 provided to diffuse and pass the light irradiated from the BLU 38 to the display panel 34. The light diffuser plate 36 may be arranged behind the display panel 34.

The display module 30 may further include an optical sheet 35 arranged in front of the light diffuser plate 36. The optical sheet 35 may be settled on the front surface of the light diffuser plate 36. The optical sheet 35 may include a prism film 36b for concentrating the light diffused by the light diffuser plate 36 to a direction perpendicular to the display panel 34. The optical sheet 35 may further include a protective film 35a for protecting the prism film 35b. The protective film 35a may be arranged on the front surface of the prism film 35b. The protective film 35a protects many different parts included in the BLU 38 against external shocks or inflow of foreign materials. The prism film 35b in particular is easily scratched, so the protective film 35a arranged on the front surface of the prism film 35b may prevent the prism film 35b from being scratched. The optical sheet 35 may further include a double brightness enhancement film (DBEF) (not shown). The DBEF may be arranged on the surface of the protective film 35a. The DBEF is a type of polarizer film, and also called a reflective polarizer film. The DBEF is transparent to some of rays irradiated from the BLU 38, which are polarized in parallel with the polarization direction of the DBEF, and reflects some other rays polarized in different directions than the polarization direction of the DBEF. The reflected rays are recycled in the backlight unit 38, thereby enhancing brightness of the display module 30.

Although it has thus far been focused on the display module 30 having a direct type BLU, in which the light sources 38a are arranged right under the display panel 34, applied thereto, an edge type BLU, in which the light sources 38a are arranged one of a plurality of long edges and a plurality of short edges of the display panel 34, may also be applied to the display module 30.

Figure 9:
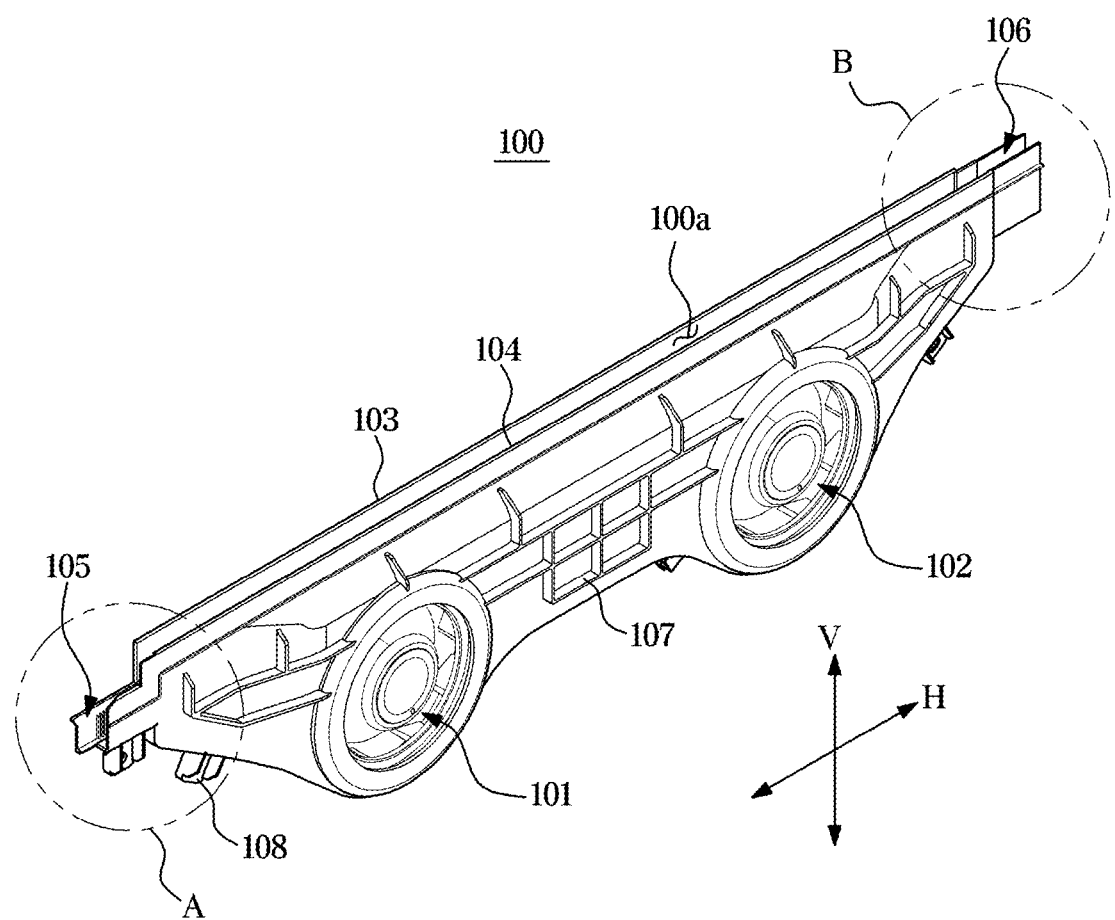
FIG. 9 shows an air circulator in a display device, according to an embodiment of the disclosure.
Figure 10:
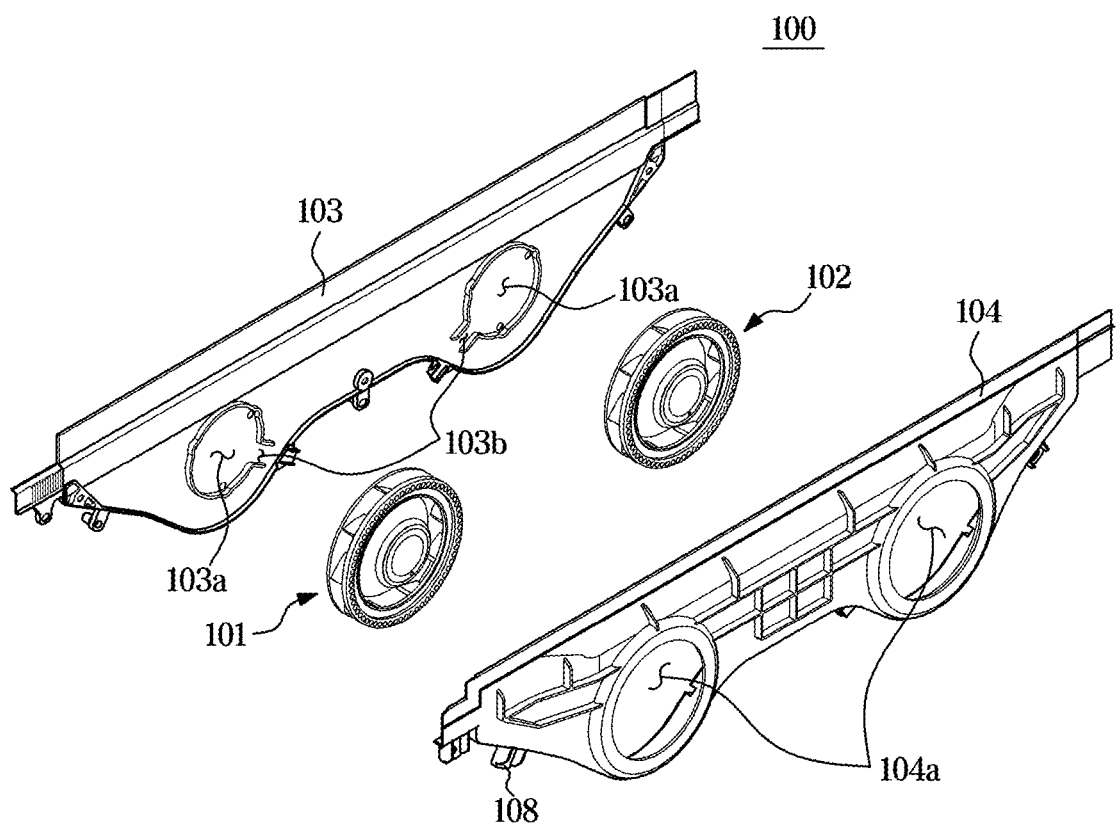
FIG. 10 is an exploded view of the air circulator shown in FIG. 9.

FIG. 9 shows an air circulator in a display device, according to an embodiment of the disclosure. FIG. 10 is an exploded view of the air circulator shown in FIG. 9.

Referring to FIGS. 9 and 10, the air circulator 100 may include cases 103 and 104 defining the exterior of the air circulator 100. The cases 103 and 104 may extend along the long edges of the display device 1. The cases 103 and 104 may include the front case 103 and the rear case 104.

An outlet 100a may be formed between the front case 103 and the rear case 104. Although the outlet 100a is shown as being open at the top of the cases 103 and 104, it is not limited thereto and may be open at the bottom of the cases 103 and 104. In this case, the air circulator 100 may send the air first to the lower area 84 and then withdraw the air through the upper area 83.

The outlet 100a may be formed between an end and the other end in the second direction V of the cases 103 and 104. That is, the outlet 100a may extend from one end to the other end in the second direction V of the cases 103 and 104.

The front case 103 may be located next to the display module 30.

The rear case 104 may be located next to the rear cover 12. The rear case 104 may include a sucking hole 104a through which a circulation fan 101 or 102 sucks in the internal air. The sucking hole 104a may be formed in a correspond size and shape to the circulation fan 101 or 102. The rear case 104 may further include a reinforcing rib 107. The reinforcing rib 107 may be formed on the outer surface of the rear case 104 to reinforce rigidity of the cases 103 and 104. The shape of the reinforcement rib 107 is not limited to what is shown in the drawings, but may include other various shapes.

The air circulator 100 may include the cases 103 and 104 defining the exterior, and the circulation fans 101 and 102 for circulating the internal air. The circulation fans 101 and 102 may be arranged between the front case 103 and the rear case 104. The circulation fans 101 and 102 may suck in air within the rear plate 50 and the rear cover 12 through the sucking hole 104a and discharge the air through the open top between the front case 103 and the rear case 104. The circulation fans 101 and 102 may be centrifugal fans that suck in air in the axial direction and discharge the air in the radial direction. However, the type of the circulation fan is not limited thereto, but may include other various types of fans that are able to circulate air.

The circulation fans 101 and 102 may include the first circulation fan 101 and the second circulation fan 102. The first and second circulation fans 101 and 10 may be separately arranged within the cases 103 and 104. Although there are two circulation fans 101 and 102 shown, there are no limitations on the number of the circulation fans, and there may be one or three or more circulation fans. When there is one circulation fan, the fan may be used in a small display device. On the other hand, a large display device may use three or more circulation fans. In the case of the large display device, it may connect to a plurality of air circulators 100 for use.

The air circulator 100 may further include a fastening part 108. At least one fastening part 108 may be formed at each of the front and rear cases 103 and 104. The fastening part 108 may couple the cases 103 and 104 with the rear plate 50. Accordingly, the air circulator 100 may be stably coupled to the rear plate 50.

The air circulator 100 may further include a receiving part 103a and an open part 103b. The receiving part 103a and the open part 103b may be formed on the inner surface of the front case 103. The receiving part 103a may be formed in a shape that matches the circulation fan 101 or 102 to securely receive the circulation fan 101 or 102. The open part 103b may be connected to the receiving part 103a for holding circuit lines to control the circulation fans 101 and 102. The shapes of the receiving part 103a and the open part 103b are not limited to what are shown in the drawings.

The air circulator 100 may further include connection ports 105 and 106 provided at either end of the cases 103 and 104. The connection ports 105 and 106 may include the first connection port 105 and the second connection port 106. The first coupling protrusions 105a may be formed at the first connection port 105. The second coupling protrusions 106a may be formed at the second connection port 106.

The first and second connection ports 105 and 106 are open in the first direction H, allowing the air to be discharged to another air circulator 100. Furthermore, the first and second connection ports 105 and 106 are open in the second direction V, allowing the air to be discharged into the front area 81.

The first and second coupling protrusions 105a and 106a may be coupled to each other at the first and second connection ports 105 and 106, and the blocking member 200 and the coupling protrusions 105a and 106a of the air circulator 100 may be coupled to each other. Furthermore, there may be coupling space 141 and an extra coupling space 142 formed.

The top of the cases 103 and 104 may be opened to send air to the upper area 83, and the bottom of the case 103 and 104 may be tightly closed to prevent air leaks (see FIGS. 2 and 4). Accordingly, there are no air leaks through the bottom of the cases 103 and 104, so the most internal air may flow past the upper area 83 to the front area 81. Due to lots of internal air flowing in the front area 81, degradation of the display panel 34 may be reduced.

Figure 11:
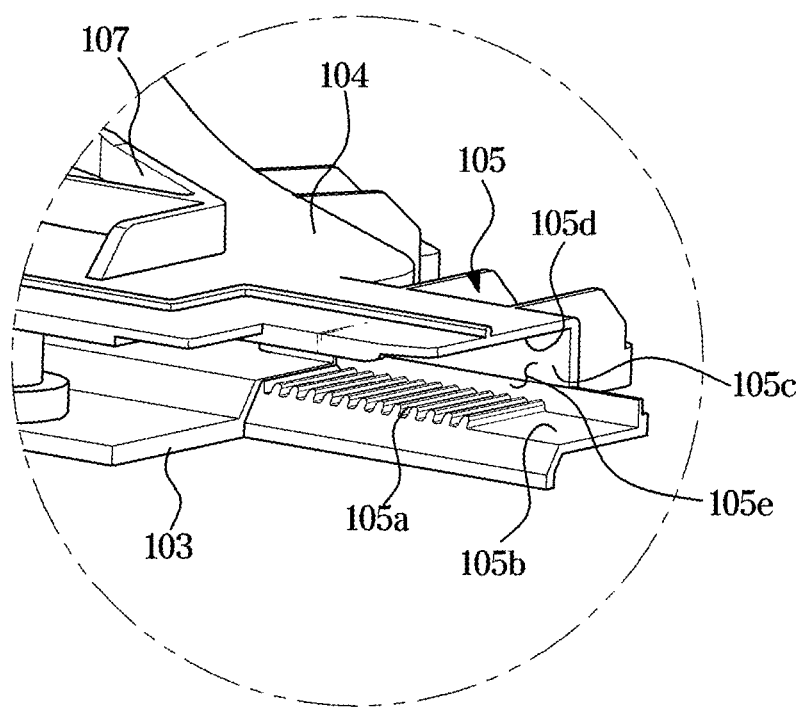
FIG. 11 shows first coupling protrusions in the air circulator shown in FIG. 9.
Figure 12:
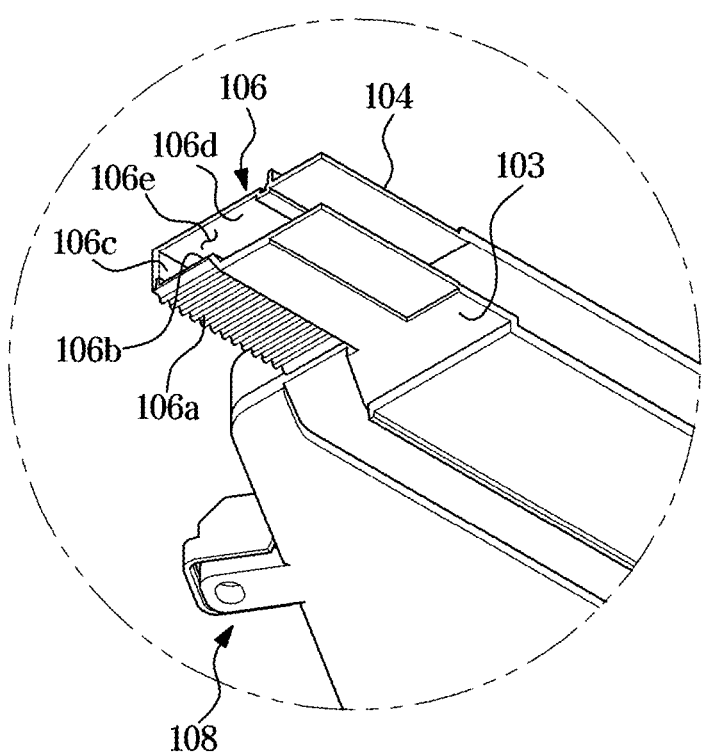
FIG. 12 shows second coupling protrusions in the air circulator shown in FIG. 9.

FIG. 11 shows first coupling protrusions in the air circulator shown in FIG. 9. FIG. 12 shows second coupling protrusions in the air circulator shown in FIG. 9.

Referring to FIGS. 11 and 12, the connection ports 105 and 106 may include the coupling protrusions 105a and 106b, first walls 105b and 106b, second walls 105c and 106c, third walls 105d and 106d, and connecting holes 105e and 106e. The coupling protrusions 105a and 106a may include the first coupling protrusions 105a and the second coupling protrusions 106a.

Specifically, the first connection port 105 may include the first coupling protrusions 105a, the first wall 105b, the second wall 105c, the third wall 105d, and the first connecting hole 105e. The second connection port 106 may include the first coupling protrusions 106a, the first wall 106b, the second wall 106c, the third wall 106d, and the second connecting hole 106e.

The first coupling protrusions 105a may protrude toward the inside of the case from the inner surface of the case, and the second coupling protrusions 106a may protrude toward the outside of the case from the outer surface of the case. FIG. 11 shows portion A of FIG. 9, and FIG. 12 shows portion B of FIG. 9.

The coupling protrusions 105a and 106a may be formed on the front case 103. The first coupling protrusions 105a may be formed at an end of the front case 103. The first coupling protrusions 105a may protrude towards the rear case 104 from the inner surface of the front case 103. The second coupling protrusions 106a may protrude to the outside of the front case 103 from the outer surface of the front case 103.

The first walls 105b and 106b may define a wall of the front case 103. The second walls 105c and 106c may be formed to connect to the first walls 105b and 16b and the third walls 105d and 106d. The third walls 105d and 106d may define a wall of the rear case 104. The connecting holes 105e and 106e may be provided in space between the first, second, and third walls 105b and 106b, 105c and 106c, and 105d and 106d.

Figure 13:
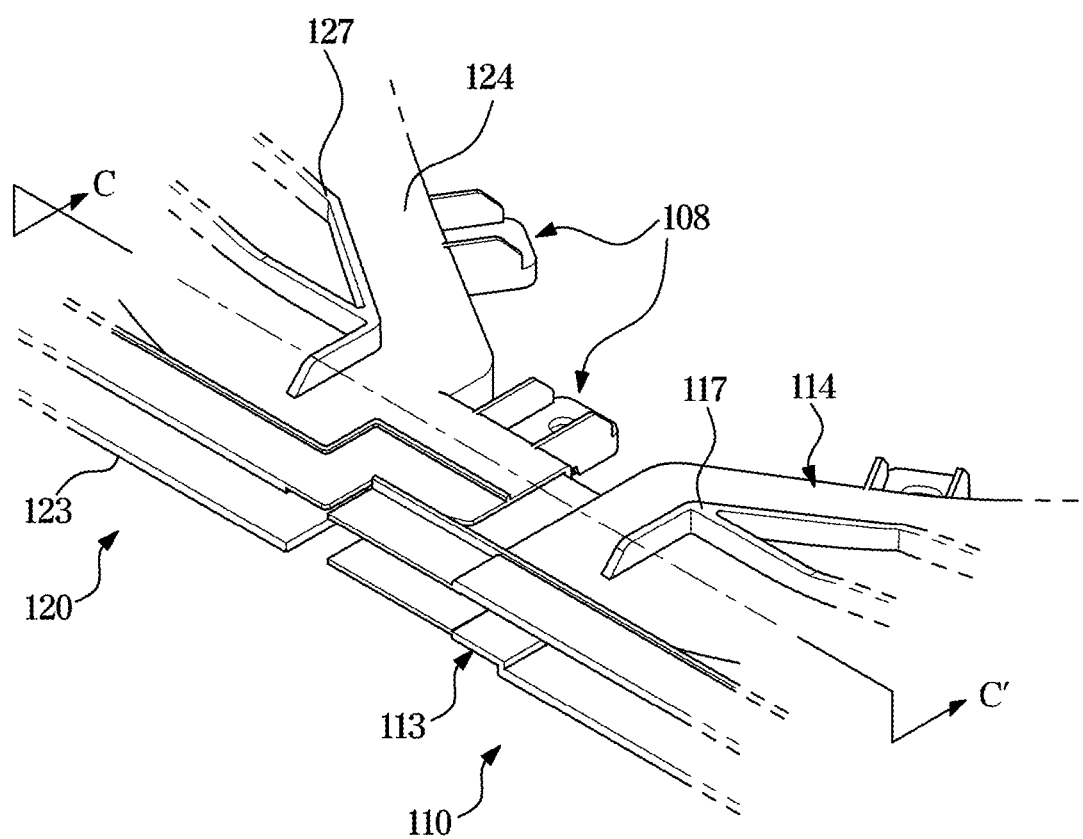
FIG. 13 shows a coupling relationship between the air circulators shown in FIG. 9.
Figure 14:
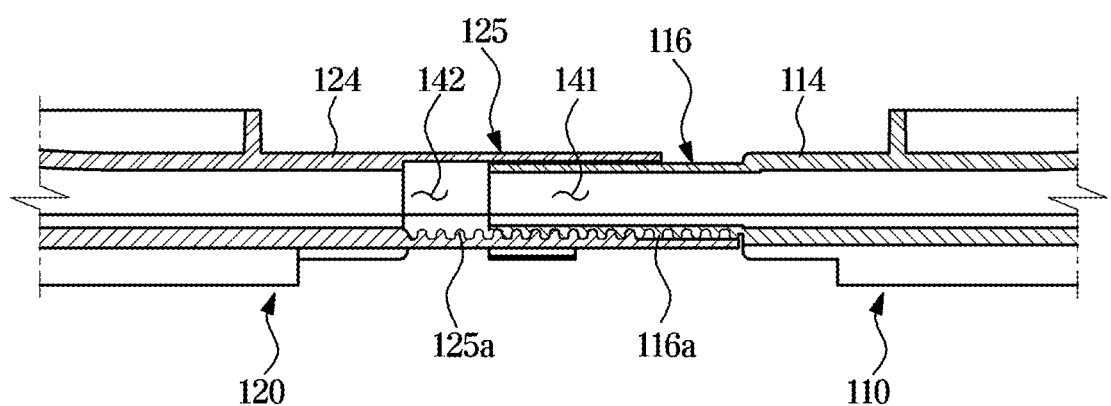
FIG. 14 is a cross-sectional view of the coupling relationship between the air circulators shown in FIG. 13 cut along C-C'.

FIG. 13 shows a coupling relationship between the air circulators shown in FIG. 9. FIG. 14 is a cross-sectional view of the coupling relationship between the air circulators shown in FIG. 13 cut along C-C'.

Referring to FIGS. 13 and 14, the first and second air circulators 110 and 120 may each include a front case 113 and 123 and a rear case 114 and 124. Second coupling protrusions 116a formed on the front case 113 of the first air circulator 110 may be coupled to first coupling protrusions 115a formed on the front case 123 of the second air circulator 120. The number of the protrusions coupled in the coupling space 141 may vary depending on the length of the display device. For example, when the horizontal length of the display device is short, a large number of the second coupling protrusions 116a of the first air circulator 110 and the first coupling protrusions 115a of the second air circulator 120 may be coupled to avoid creating the extra coupling space 142. On the other hand, when the horizontal length of the display device is long, a small number of the second coupling protrusions 116a of the first air circulator 110 and the first coupling protrusions 115a of the second air circulator 120 may be coupled to create the extra coupling space 142 to be wide.

As the first and second coupling protrusions 115a and 116a are coupled to each other, air leaks from the coupling space to the outside may be reduced. Accordingly, the heat radiating from the display panel 34 may be fully managed and forced to circulate the front area 81 more effectively, which may reduce degradation of the display panel 34.

Figure 15:
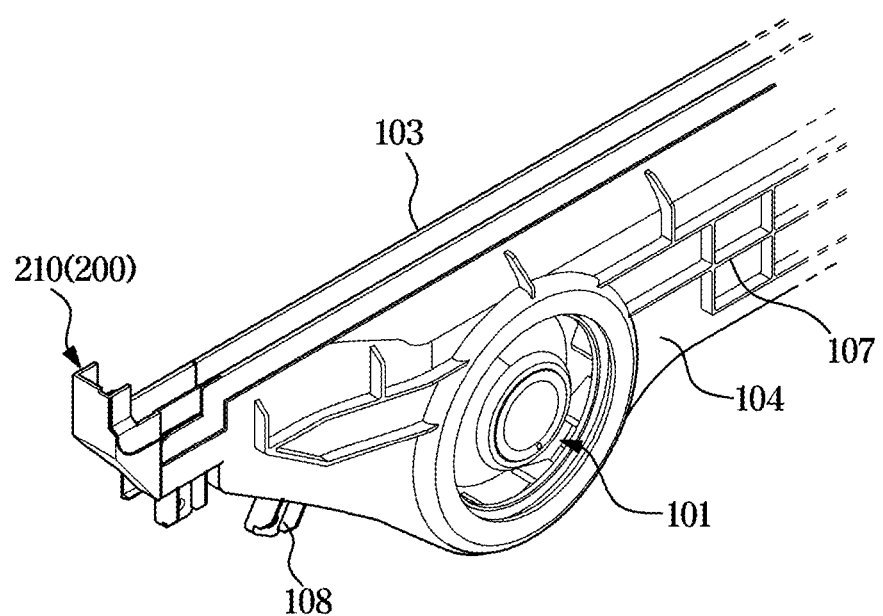
FIG. 15 shows a coupling relationship between an air circulator and a first blocking member in a display device, according to an embodiment of the disclosure.
Figure 16:
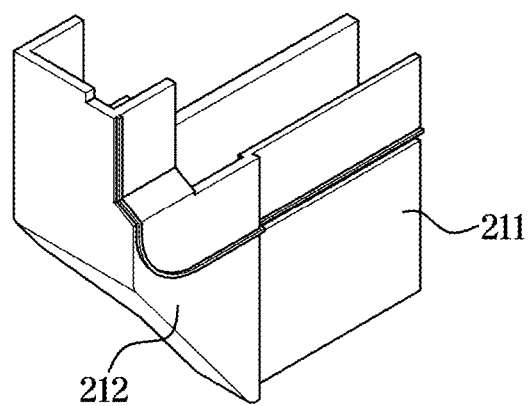
FIG. 16 shows the first blocking member in the display device shown in FIG. 15.
Figure 17:
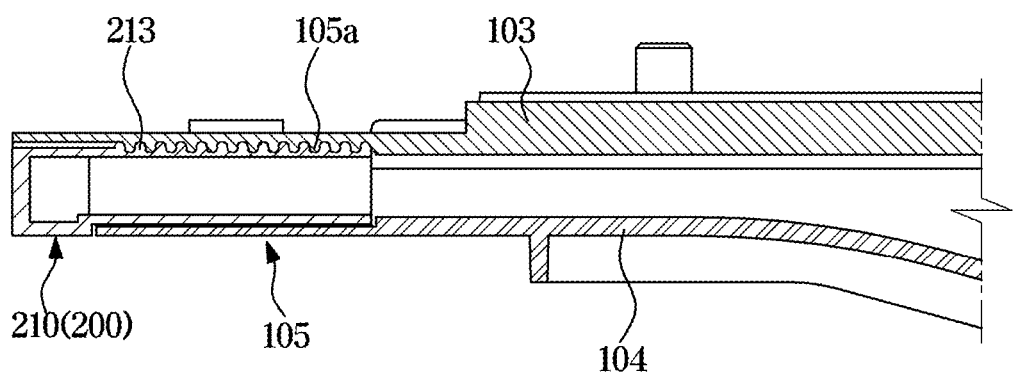
FIG. 17 is a coupling cross-section between the air circulator and the first blocking member shown in FIG. 15.
Figure 18:
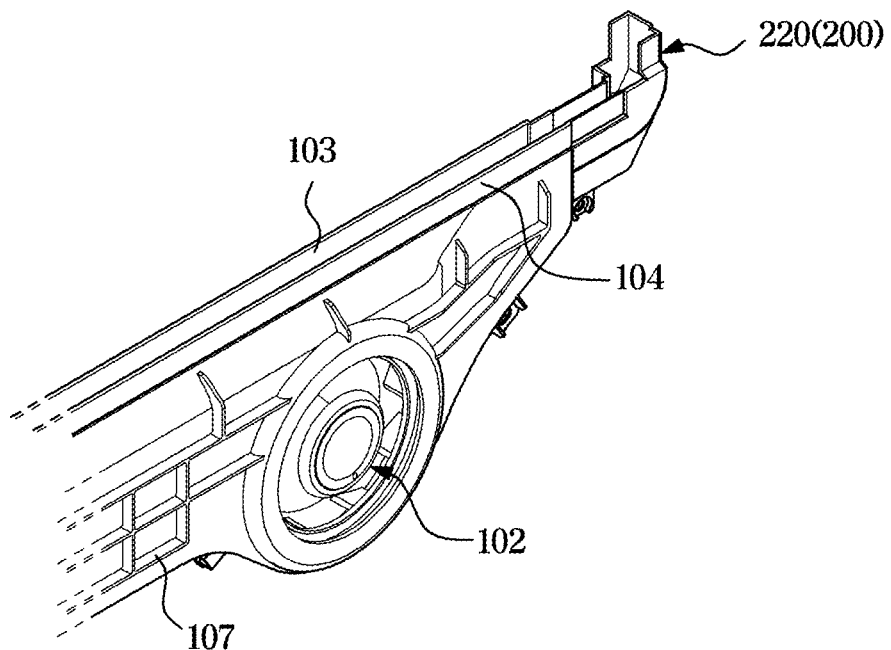
FIG. 18 shows a coupling relationship between an air circulator and a second blocking member in a display device, according to an embodiment of the disclosure.
Figure 19:
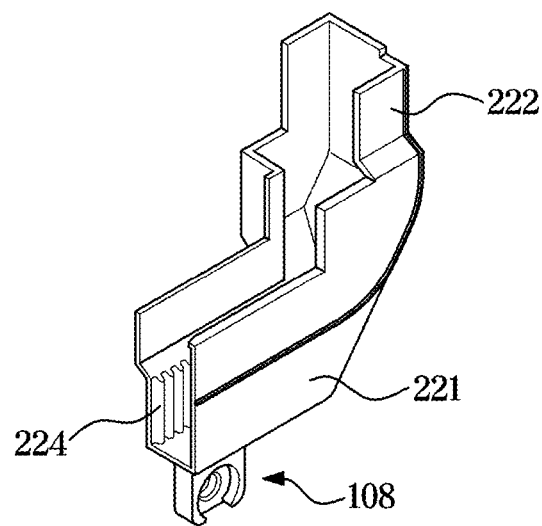
FIG. 19 shows the second blocking member in the display device shown in FIG. 18.

FIG. 15 shows a coupling relationship between an air circulator and a first blocking member in a display device, according to an embodiment of the disclosure. FIG. 16 shows the first blocking member in the display device shown in FIG. 15. FIG. 17 is a coupling cross-section between the air circulator and the first blocking member shown in FIG. 15. FIG. 18 shows a coupling relationship between an air circulator and a second blocking member in a display device, according to an embodiment of the disclosure. FIG.

Figure 20:
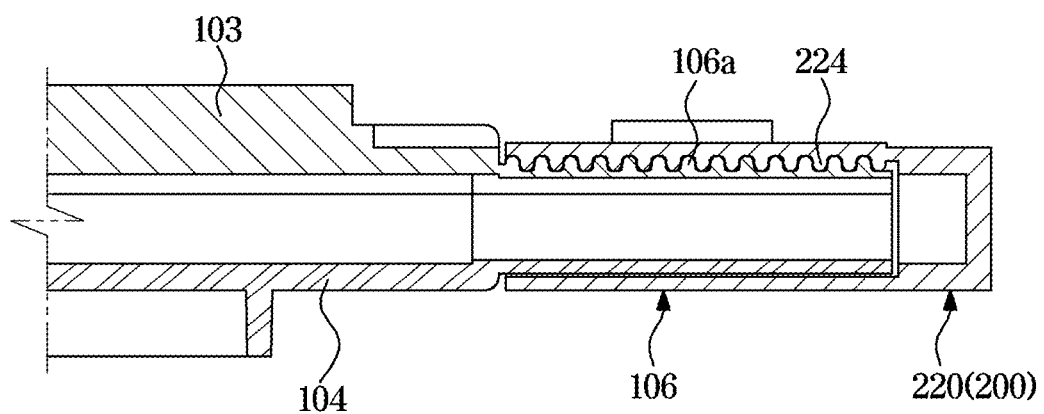
FIG. 20 is a coupling cross-section between the air circulator and the second blocking member shown in FIG. 18.

19 shows the second blocking member in the display device shown in FIG. 18. FIG. 20 is a coupling cross-section between the air circulator and the second blocking member shown in FIG. 18.

Referring to FIGS. 15 to 20, the air circulator 100 may include the blocking member 200. The blocking member 200 may be coupled to the air circulator 100. The blocking member 200 may be coupled to the end of the case 103 and 104 to prevent air leakage.

The blocking member 200 may include a first part 201 and a second part 202. The first part 201 may include an assembling protrusion to be coupled to the case 103 and 104, which will be described later. The second part 202 may bend from the first part 201 to be coupled to the housing 10. The blocking member 200 may further include the fastening part 108 to couple to the rear plate 50. The fastening part 108 may protrude from the first part 201. The structure and shape of the blocking member 200 is not limited to what is described above, but may include any of various structures and shapes that prevent air leaks from the air circulator 100.

The blocking member may include the first blocking member 210 and the second blocking member 220.

The first blocking member 210 may be coupled to an end of the case to prevent air leaks from corner areas of the outer frame 11. Specifically, the first blocking member 210 may be coupled to the left end of the front case 103.

The first blocking member 210 may include a first assembling protrusion 213 protruding outwards from the outer surface of the first blocking member 210. The first assembling protrusion 213 may be coupled to the first coupling protrusion 105a.

The second blocking member 220 may be coupled to the other end of the case to prevent air leaks from corner areas of the outer frame 11. Specifically, the second blocking member 220 may be coupled to the right end of the front case 103.

The second blocking member 220 may include a second assembling protrusion 224 protruding outwards from the outer surface of the second blocking member 220. The second assembling protrusion 224 may be coupled to the second coupling protrusion 106a.

According to the disclosure, an air circulator circulates air inside a display device to prevent degradation of the front surface of a display panel in the display device.

A coupling structure of the air circulator may force the air to circulate on every corner of the front surface of the display panel.

The air circulator may be modularized for use.

Several embodiments of the disclosure have been described above, but a person of ordinary skill in the art will understand and appreciate that various modifications can be made without departing the scope of the disclosure. Thus, it will be apparent to those ordinary skilled in the art that the true scope of technical protection is only defined by the following claims.

What is claimed is:

1. A display device comprising:
a housing including a front glass and a rear cover;
a display panel arranged within the housing; and
an air circulator arranged behind the display panel to circulate air between the front glass and a front surface of the display panel, the air circulator including a case and a fan arranged in the case,
wherein the case of the air circulator comprises:
an outlet formed to discharge the air along a first direction;
a first connection port formed at one end of the case along a second direction perpendicular to the first direction along which the air is discharged, wherein the second direction is a left-right direction; and
a second connection port formed at another end of the case along the second direction opposite the one end of the case on which the first connection port is formed,
wherein a first coupling protrusion is formed at the one end of the case, and a second coupling protrusion is formed at the other end of the case, and
wherein the first coupling protrusion protrudes to an inside of the case from an inner surface of the case, and the second coupling protrusion protrudes to an outside of the case from an outer surface of the case.

2. The display device of claim 1, wherein the outlet is formed on an upper portion of the case.

3. The display device of claim 2, wherein the outlet extends from the one end of the case to the other end of the case along the second direction.

4. The display device of claim 2, further comprising:
an outer frame coupleable to the front glass and the rear cover;
wherein, while the outer frame is coupled to the front glass and the rear cover, the air discharged from the air circulator is guided past an upper area between the outer frame and an upper surface of the display panel and a front area between the front glass and the front surface of the display panel.

5. The display device of claim 4, wherein the air guided to the front area passes a lower area between the outer frame and a lower surface of the display panel.

6. The display device of claim 5, wherein the air having passed the lower area is withdrawn to the air circulator.

7. The display device of claim 2, wherein a lower portion of the case is sealed to prevent air leaks.

8. The display device of claim 1, further comprising:
a first blocking member coupleable to the first connection port to seal the first connection port, and
a second blocking member coupleable to the second connection port to seal the second connection port.

9. The display device of claim 8, wherein the first coupling protrusion is formed on the first connection port and the second coupling protrusion is formed on the second connection port, and
the first blocking member is coupleable to the first coupling protrusion and the second blocking member is coupleable to the second coupling protrusion.

10. The display device of claim 9, wherein the first blocking member comprises a first assembling protrusion protruding to an outside of the first blocking member from an outer surface of the first blocking member to be coupled to the first coupling protrusion, and
the second blocking member comprises a second assembling protrusion protruding to an inside of the second blocking member from an inner surface of the second blocking member to be coupled to the second coupling protrusion.

11. The display device of claim 1, wherein:
the air circulator is among a plurality of air circulators,
the air circulator is a first air circulator and the plurality of air circulators includes a second air circulator arranged along the second direction, and
the second coupling protrusion of the first air circulator is coupleable to a first coupling protrusion of the second air circulator.

12. The display device of claim 1, wherein the case comprises a front case arranged adjacent to the display panel and a rear case arranged adjacent to the rear cover, and
  wherein the first coupling protrusion and the second coupling protrusion are provided on the front case.

13. The display device of claim 1, further comprising:
  an inlet arranged at a rear surface of the case to suck the air into the air circulator.

14. A display device comprising:
  a display panel to display an image;
  a front glass arranged on a front surface of the display panel;
  a rear plate arranged on a rear surface of the display panel to support the display panel; and
  an air circulator arranged behind the rear plate to circulate air between the front surface of the display panel and the front glass, the air circulator including a fan to circulate the air and a case to accommodate the fan, where a top of the case is open,
  wherein the air circulator is formed to guide the air past an upper area between an outer frame and an upper surface of the display panel and a front area between the front glass and the front surface of the display panel and
  wherein the case of the air circulator comprises:
    a first coupling protrusion that is formed at one end of the case, and a second coupling protrusion that is formed at another end of the case opposite the one end, and
  wherein the first coupling protrusion protrudes to an inside of the case from an inner surface of the case, and a second coupling protrusion protrudes to an outside of the case from an outer surface of the case.

15. The display device of claim 14, wherein a bottom of the case is sealed to prevent air leaks.

16. A display device comprising:
  a housing including a front glass and a rear cover;
  a display panel arranged within the housing; and
  a first air circulator and a second air circulator separately arranged behind the display panel for circulating air between the front glass and a front surface of the display panel,
  wherein the first air circulator and the second air circulator each comprise:
    a fan to circulate air; and
    a case to accommodate the fan,
  wherein the case comprises:
    an outlet formed to discharge the air along a first direction;
    a first connection port formed at one end of the case along a second direction perpendicular to the first direction along which the air is discharged; and
    a second connection port formed at another end of the case along the second direction.

17. The display device of claim 16, wherein the first air circulator and the second air circulator each further comprise a first coupling protrusion and a second coupling protrusion.

18. The display device of claim 17, wherein
  the first coupling protrusion of the second air circulator protrudes to an inside of the case of the first air circulator from an inner surface of the case of the first air circulator at the one end of the case, and
  the second coupling protrusion of the first air circulator protrudes to an outside of the case of the second air circulator from an outer surface of the case of the second air circulator at the other end of the case, and
  wherein the second coupling protrusion of the first air circulator is coupleable to the first coupling protrusion of the second air circulator.

* * * * *